(12) United States Patent
Koscielnik et al.

(10) Patent No.: US 9,612,581 B1
(45) Date of Patent: Apr. 4, 2017

(54) METHOD AND APPARATUS FOR CONVERSION OF TIME INTERVAL TO DIGITAL WORD USING SUCCESSIVE APPROXIMATION SCHEME

(71) Applicant: Akademia Gorniczo-Hutnicza im. Stanislawa Staszica, Cracow (PL)

(72) Inventors: Dariusz Koscielnik, Cracow (PL); Marek Miskowicz, Cracow (PL)

(73) Assignee: Akademia Gorniczo-Hutnicza im. Stanislawa Staszica, Cracow (PL)

( * ) Notice: Subject to any disclaimer, the term of this patent is extended or adjusted under 35 U.S.C. 154(b) by 0 days.

(21) Appl. No.: 14/974,190

(22) Filed: Dec. 18, 2015

(51) Int. Cl.
*H03M 1/38* (2006.01)
*G04F 10/00* (2006.01)

(52) U.S. Cl.
CPC ............ *G04F 10/005* (2013.01); *H03M 1/38* (2013.01)

(58) Field of Classification Search
CPC ...... H03M 1/125; H03M 1/124; H03M 1/466; H03M 1/68; H03M 1/66; H03M 1/76; H03M 1/682; H03M 1/765; G04F 10/005

USPC .................................................. 341/144–172
See application file for complete search history.

(56) References Cited

U.S. PATENT DOCUMENTS

| | | | |
|---|---|---|---|
| 8,830,111 B2 * | 9/2014 | Koscielnik | ............ G04F 10/005 341/155 |
| 9,063,518 B2 * | 6/2015 | Koscielnik | ............ G04F 10/005 |
| 9,065,466 B2 * | 6/2015 | Koscielnik | ............ H03M 1/125 |

* cited by examiner

*Primary Examiner* — Lam T Mai
(74) *Attorney, Agent, or Firm* — Ladas & Parry LLP

(57) ABSTRACT

A method and apparatus for conversion of a time interval to a digital word, the time interval being mapped to a difference of a length of a reference time and a length of a signal time. Reference time is generated from an instant when the beginning of the time interval is detected, and the signal time is generated from an instant when the end of the time interval is detected by the use the control module. The generation of the reference time and the signal time is terminated at the same instant. In the apparatus, bottom plates of capacitors of the set of capacitors are connected to a ground of the circuit, and top plates of these capacitors are connected, respectively, to moving contacts of change-over switches First, second, and third stationary contacts are connected to the signal rail, the ground of the circuit, and to the reference rail.

8 Claims, 2 Drawing Sheets

METHOD AND APPARATUS FOR CONVERSION OF TIME INTERVAL TO DIGITAL WORD USING SUCCESSIVE APPROXIMATION SCHEME

The application claims priority to Polish Patent Application No. P413960, filed Sep. 14, 2015, and Polish Patent Application No. P413964, filed Sep. 14, 2015, both of which are incorporated herein by reference.

The subject of this invention is a method and an apparatus for conversion of a time interval to a digital word using a successive approximation scheme that can be applied in monitoring and control systems.

A method for conversion of a time interval to a digital word known from a patent description U.S. Pat. No. 9,063,518 (WO2011/152744) consists of two stages.

In the first stage, a time interval is translated to a portion of electric charge through charging a sampling capacitor by a current source during the input time interval. The portion of electric charge is directly proportional to the time interval. After detection of an end of the time interval, the second stage of conversion starts. During the second stage of conversion, the portion of electric charge is converted to the digital word by its redistribution from the sampling capacitor to a set of capacitors of binary-weighted capacitances. Each capacitor corresponds to a bit in output digital word.

In each step of the second stage of conversion, the redistribution is realized by charge transfer between two capacitors. A capacitor that is actually a source of charge is called a current source capacitor. A capacitor that actually collects charge is called a current destination capacitor. The current destination capacitor has always lower capacitance than the current source capacitor. Moving the charge results in growing the voltage on the current destination capacitor and at the same time in falling the voltage on the current source capacitor. If the voltage on the current destination capacitor reaches the reference voltage before the voltage on the current source capacitor falls to zero, then, in the next conversion step, the charge transfer is continued to a new destination capacitor whose capacitance is twice lower than a capacitance of the current destination capacitor. If the voltage on the current source capacitor falls to zero before the current destination capacitor reaches the reference voltage, then, in the next conversion step, the current destination capacitor becomes a new source capacitor, and a new destination capacitor has a capacitance twice lower than a capacitance of the current destination capacitor. If a voltage on a particular capacitor equals the reference voltage, then a value one is assigned to a bit in the output digital word corresponding to this capacitor, and a value zero is assigned to other bits.

An apparatus for conversion of a time interval to a digital word known from the patent description U.S. Pat. No. 9,063,518 (WO2011/152744) comprises a sampling capacitor and a set of binary-weighted capacitances. The bottom plate of each capacitor is connected through a change-over switch to the ground of the circuit, or to a source of auxiliary voltage, while a value of auxiliary voltage is higher enough than a value of a reference voltage. A non-inverting input of a first comparator is also connected to the source of auxiliary voltage. The first comparator is used to detect that a source capacitor is completely discharged. The inverting input of the first comparator is connected to a source rail. A non-inverting input of a second comparator is connected to the source of reference voltage, and an inverting input of the second comparator is connected to a destination rail. The second comparator is used to detect that a voltage on a destination capacitor reaches the reference voltage. The destination rail is connected through an on-off switch to the ground of the circuit and to an output of a current source whose input is connected through a change-over switch to the source rail or to a source of supply voltage. A top plate of each capacitor is connected through a source on-off switch to the source rail, and a destination on-off switch to the destination rail. Control inputs of the change-over switches and on-off switches are connected to relevant control outputs of a control module. A destination on-off switch corresponding to a given capacitor is controlled by the same control output of the control module, while a source on-off switch is controlled by another control output of the control module. Outputs of both comparators and a time input are also connected to the control module. Besides, the control module comprises a digital output and a complete conversion output.

A method for conversion of a time interval to a digital word using a successive approximation scheme consists in a detection of a beginning and of an end of the time interval by the use of a control module and in assignment of a corresponding binary value represented by n-bit output digital word to the time interval by the use of the control module.

The essence of the method, according to the invention, consists in that the time interval is mapped to a difference of a length of a reference time and a length of a signal time. The reference time is generated from an instant when the beginning of the time interval is detected by the use the control module, and the signal time is generated from an instant when the end the time interval is detected by the use the control module. The generation of the reference time and the signal time is terminated at the same instant.

It is advantageous if the generation of the reference time is realized by charging a capacitor using a reference current source, while this capacitor is selected by the use of the control module from a set of capacitors that comprise capacitors, such that a capacitance of a capacitor of a given index is twice as high as a capacitance of a capacitor of the previous index. A capacitor of the highest capacitance in the set of capacitors is selected first. A selected capacitor is charged as long as the reference voltage increasing on the selected capacitor and compared to the threshold voltage by the use of the reference comparator reaches the threshold voltage. Then, a next capacitor in the set of capacitors is started to be charged while this capacitor has the highest capacitance among the capacitors that have not been charged yet. The reference voltage increasing on the capacitor being charged is compared to the threshold voltage by the use of the reference comparator, and the cycle is repeated to the end of generation of both time intervals.

The generation of the signal time is realized by charging a capacitor by the use of the signal current source, while this capacitor selected by the use of the control module from a set of capacitors has the highest capacitance among the capacitors that have not been charged yet. The selected capacitor is charged as long as the signal voltage increasing on this capacitor and compared to the threshold voltage by the use of the signal comparator equals the threshold voltage. Then, a next capacitor in the set of capacitors is started to be charged by the use of the signal current source while this capacitor is selected in the same way and the cycle is repeated to the end of generation of both time intervals.

The generation of the reference time, and the generation of the signal time are terminated during the time when the capacitor of the lowest capacitance in the set of capacitors is charged, and when the reference voltage increasing on a capacitor charged by the use of the reference current source, or when the signal voltage increasing on a capacitor charged by the use of the signal current source reaches the threshold voltage.

It is advantageous if intensity of the reference current source is lower than intensity of the signal current source during the time interval, and intensity of the reference current source is increased by the use of the control module to intensity of the signal current source at the instant when generation of the time interval is terminated by the use of the control module.

It is advantageous if a value representing n-bit output digital word being a conversion result is evaluated by the use of the control module by subtracting a value of a second n-bit digital word from a value of a first n-bit digital word. A value one is assigned to bits of the first digital word if capacitors in the set of capacitors corresponding to these bits have been charged by the reference current source. A value zero is assigned to other bits of the first digital word. The inverted values of the first digital word are assigned to corresponding bits of the second digital word by the use of the control module. The value of n-bit output digital word is decreased by one if a voltage on the last capacitor charged by the reference current source has not reached the threshold voltage.

It is advantageous if a value representing n-bit output digital word being a conversion result is evaluated by the use of the control module in the following way. The control module assigns a value one to a bit in this digital word if a next capacitor is not started to be charged by the use of the signal current source during a time when a capacitor corresponding to the particular bit in the set of capacitors is charged by the use of the reference current source. The control module assigns also a value one to a bit in this digital word if, a next capacitor is started to be charged by the use of the reference current source during a time when a capacitor corresponding to the particular bit in the set of capacitors is charged by the use of the signal current source. The control module assigns a value zero to the bit otherwise.

An apparatus for conversion of a time interval to a digital word, according to the invention, comprising a control module having a time input, a digital output, a complete conversion output, a reference input connected to a reference comparator output, a signal input connected to a signal comparator output, a reference output connected to a control input of a reference current source, a signal output connected to a control input of a signal current source, and control outputs of change-over switches of a set of capacitors. A capacitance value of a capacitor of a given index is twice as high as a capacitance value of the capacitor of the previous index. A non-inverting input of the reference comparator is connected to a reference rail and to an output of the reference current source, whose input is connected to a source of a voltage supply. An inverting input of the reference comparator is connected to a source of a threshold voltage.

The essence of the apparatus, according to the invention, consists in that a non-inverting input of the signal comparator is connected to the signal rail and to the output of the signal current source whose input is connected to the source of the voltage supply. The inverting input of the signal comparator is connected to the source of the threshold voltage and to the inverting input of the reference comparator. Bottom plates of capacitors of the set of capacitors are connected to a ground of the circuit, and top plates of capacitors are connected respectively to moving contacts of change-over switches. First stationary contacts of the change-over switches are connected to the signal rail, second stationary contacts are connected to the ground of the circuit, and third stationary contacts are connected to the reference rail.

It is advantageous if the signal current source and the reference current source have the same intensity.

It is advantageous if intensity of the reference current source is controllable.

The advantage of the solution consists in that the operation of the apparatus is timed by two comparators which detect instants when particular conversion stages are completed. In this way a need of using an external source of timing signal that consumes considerable amount of energy is eliminated. Thereby, energy efficiency of conversion is improved.

High energy efficiency of method and apparatus, according to the invention, results also from the idle operation between conversion cycles because the solution consumes then less power if it is implemented in CMOS technology.

The permanent connection of bottom plates of all capacitors in a set of capacitors limits influence of parasitic capacitances on conversion accuracy, reduces a number of switches, and simplifies control of its operation. The use of the reference current source with controlled intensity enables independent tuning of converter input range and the maximum length of the signal time. In this way, the conversion time of the converter can be reduced compared to the situation when the reference current source of fixed intensity equal to the signal current source is used.

The solution, according to the invention, is presented in the following figures.

Figure 2:
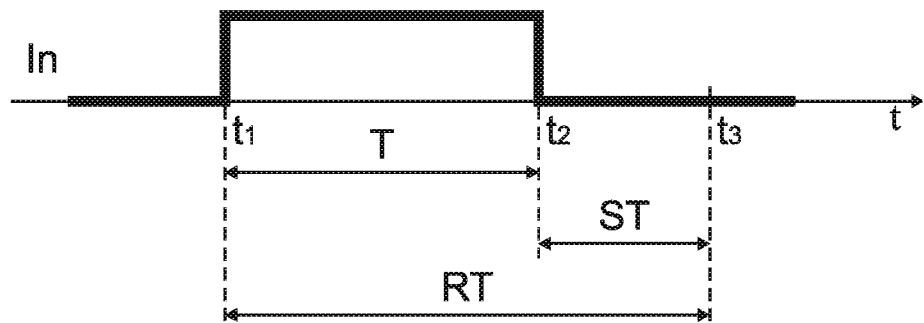
FIG. 2 illustrates a temporal relationship between an input time interval T, a reference time RT and a signal time ST.

The method for conversion of a time interval to a digital word using a successive approximation scheme, according to the invention, consists in determining a difference between a length of a reference time RT and a length of a signal time ST (FIG. 2). The reference time RT is generated from an instant $t_1$ when the beginning of the time interval T is detected by the use the control module CM. The signal time ST is generated from an instant $t_2$ when the end of the time interval T is detected by the use the control module CM. The generation of the reference time RT and the signal time ST is terminated at the same instant $t_3$ when each capacitor in the set of capacitors was charged. A binary representation of the difference between the length of the reference time RT and the length of the signal time ST is assigned by the control module to the n-bit output digital word B.

The generation of the reference time RT is realized by charging a capacitor using a reference current source $I_R$. This capacitor is selected by the use of the control module CM from a set of capacitors CS comprising capacitors $C_{n-1}$, $C_{n-2}$, . . . , $C_1$, $C_0$. The capacitor $C_{n-1}$ of the highest capacitance in the set of capacitors CS is selected first. A selected capacitor is charged as long as the reference voltage $U_R$ increasing on the selected capacitor and compared to the threshold voltage $U_{TH}$ by the use of the reference comparator $K_R$ reaches the threshold voltage $U_{TH}$. Then, a next capacitor in the set of capacitors CS is started to be charged while this capacitor has the highest capacitance among the capacitors that have not been charged yet, and the reference voltage $U_R$ increasing on this capacitor being charged is compared to the threshold voltage $U_{TH}$ by the use of the reference comparator $K_R$. The cycle is repeated until all the capacitors $C_{n-1}$, $C_{n-2}$, ..., $C_1$, $C_0$ are charged. Intensity of the reference current source $I_R$ and the signal current source $I_S$ are fixed and the same.

The generation of the signal time ST is realized by charging a capacitor by the use of the signal current source $I_S$. This capacitor selected by the use of the control module CM from a set of capacitors CS has the highest capacitance among the capacitors that have not been charged yet. The selected capacitor is charged as long as the signal voltage $U_S$ increasing on this capacitor and compared to the threshold voltage $U_{TH}$ by the use of the signal comparator $K_S$ equals the threshold voltage $U_{TH}$. Then, a next capacitor in the set of capacitors CS is started to be charged by the use of the signal current source $I_S$, while this capacitor is selected in the same way. The cycle is repeated until all the capacitors $C_{n-1}$, $C_{n-2}$, ..., $C_1$, $C_0$ are charged.

The generation of the reference time RT and the generation of the signal time ST are terminated during the time when the capacitor $C_0$ of the lowest capacitance in the set of capacitors CS is charged, and when the reference voltage $U_R$ increasing on a capacitor charged by the use of the reference current source $I_R$, or when the signal voltage $U_R$ increasing on a capacitor charged by the use of the signal current source $I_S$ reaches the threshold voltage $U_{TH}$.

Another version of the method for conversion of a time interval to a digital word using a successive approximation scheme differs from the aforementioned version in that intensity of the reference current source $I_R$ is twice lower than intensity of the signal current source $I_S$ during the time interval T. Intensity of the reference current source $I_R$ is increased by the use of the control module CM to intensity of the signal current source $I_S$ at the instant $t_2$ when the generation of the time interval T is terminated by the use of the control module CM.

In both version of the method, a binary value represented by the n-bit output digital word B, being a conversion result, is evaluated by the use of the control module CM by subtracting a value of a second n-bit digital word from a value of a first n-bit digital word. A value one is assigned to bits of the first digital word if capacitors in the set of capacitors CS corresponding to these bits have been charged by the reference current source $I_R$, and a value zero is assigned to other bits of the first digital word.

Inverted values of the first digital word are assigned to corresponding bits of the second digital word by the use of the control module CM. Finally, the binary value of n-bit output digital word B is decreased by one if a voltage on the last capacitor charged by the reference current source $I_R$ has not reached the threshold voltage $U_{TH}$.

According to another version of the method, a binary value represented by the n-bit output digital word B, being a conversion result, is evaluated by the use of the control module CM such that the control module CM assigns a value one to a bit $b_j$ in this digital word if a next capacitor $C_{j-1}$ is not started to be charged by the use of the signal current source $I_S$ during a time when a capacitor $C_j$ corresponding to the bit $b_j$ in the set of capacitors CS is charged by the use of the reference current source $I_R$, or a next capacitor $C_{j-1}$ is started to be charged by the use of the reference current source $I_R$ during a time when a capacitor $C_j$ is charged by the use of the signal current source $I_S$. On the other hand, the control module CM assigns a value zero to the bit $b_j$ otherwise.

Figure 1:
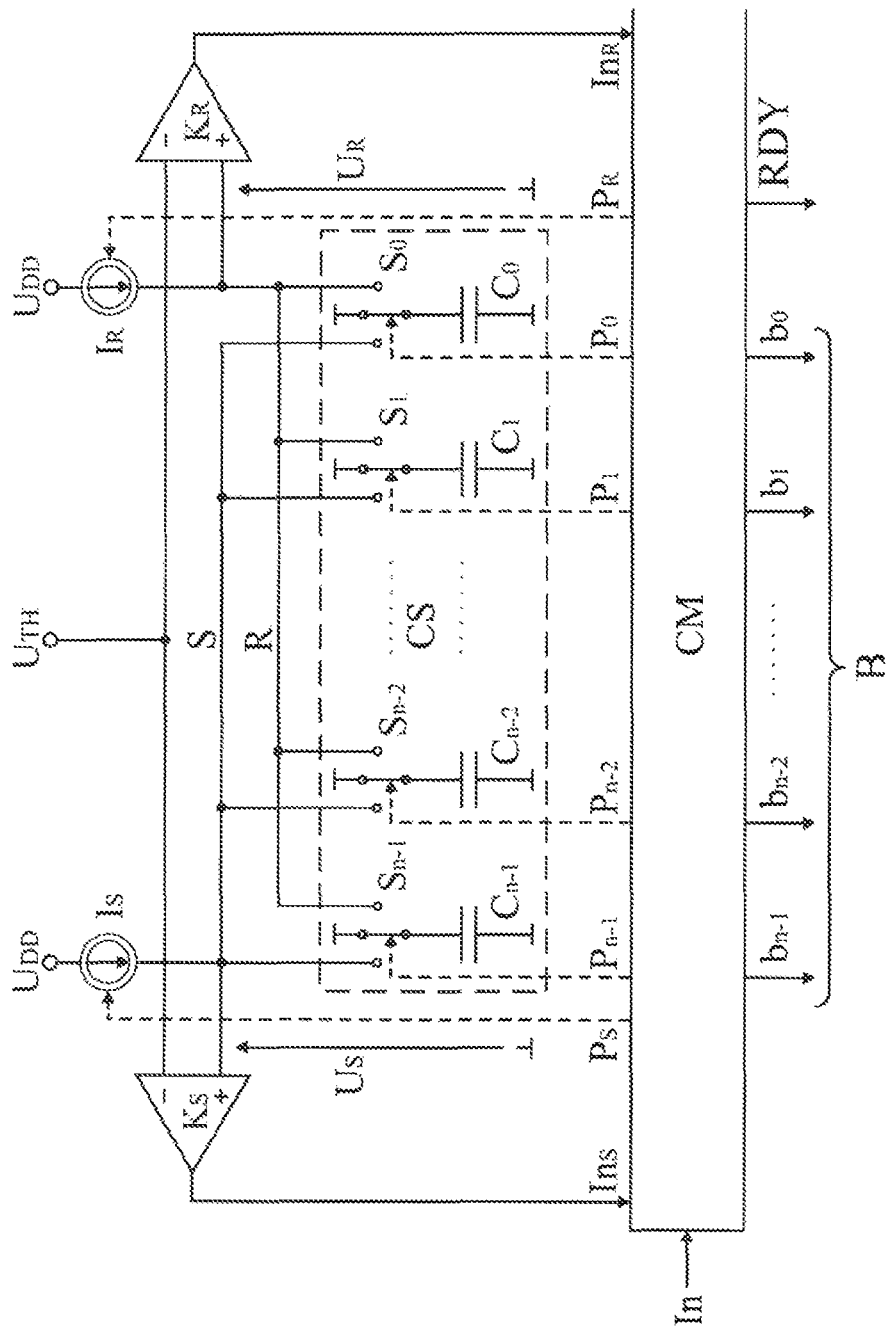
FIG. 1 illustrates a schematic diagram of the apparatus in idle state before beginning of input time interval.

In the first embodiment, an apparatus for conversion of a time interval to a digital word using a successive approximation scheme, according to the invention, comprises a control module CM having a time input In, a digital output B, a complete conversion output RDY. A reference input $In_R$ of the control module CM is connected to an output of a reference comparator $K_R$, and a signal input $In_S$ of the control module CM is connected to an output of a signal comparator $K_S$ (FIG. 1). A reference output $P_R$ of the control module CM is connected to a control input of a reference current source $I_R$, and a signal output $P_S$ of the control module CM is connected to a control input of a signal current source $I_S$. Control outputs $P_{n-1}$, $P_{n-2}$, ..., $P_1$, $P_0$ of the control module CM are connected respectively to control inputs of change-over switches $S_{n-1}$, $S_{n-2}$, ..., $S_1$, $S_0$ of a set of capacitors CS.

A capacitance value of each capacitor $C_{n-1}$, $C_{n-2}$, ..., $C_1$, $C_0$ of a given index in the set of capacitors CS is twice as high as a capacitance value of the capacitor of the previous index. A non-inverting input of the reference comparator $K_R$ is connected to a reference rail R and to an output of the reference current source $I_R$, whose input is connected to a source of a voltage supply $U_{DD}$. An inverting input of the reference comparator $K_R$ is connected to a source of a threshold voltage $U_{TH}$. A non-inverting input of the signal comparator $K_S$ is connected to the signal rail S and to the output of the signal current source $I_S$ whose input is connected to the source of the voltage supply $U_{DD}$. The inverting input of the signal comparator $K_S$ is connected to the source of the threshold voltage $U_{TH}$ and to the inverting input of the reference comparator $K_R$. Bottom plates of capacitors $C_{n-1}$, $C_{n-2}$, ..., $C_1$, $C_0$ of the set of capacitors CS are connected to a ground of a circuit, and top plates of the capacitors $C_{n-1}$, $C_{n-2}$, ..., $C_1$, $C_0$ are connected respectively to moving contacts of change-over switches $S_{n-1}$, $S_{n-2}$, ..., $S_1$, $S_0$. First stationary contacts of the change-over switches $S_{n-1}$, $S_{n-2}$, ..., $S_1$, $S_0$ are connected to the signal rail S, second stationary contacts are connected to the ground of the circuit, and third stationary contacts are connected to the reference rail R. The signal current source $I_S$ and the reference current source $I_R$ have the same intensity in the first embodiment.

In the second embodiment, the apparatus differs from the version presented in the first embodiment in that intensity of the reference current source $I_R$ is controllable, and is changed by the reference output $P_R$ of the control module CM.

The description below includes the following symbols:

x is an index of a capacitor actually charged by the use of the reference current source $I_R$, y is an index of a capacitor actually charged by the use of the signal current source $I_S$, z is an index of a capacitor having the highest capacitance among the capacitors in the set of capacitors that have not been charged yet.

The conversion of a time interval to a digital word using a successive approximation scheme according to invention in the first embodiment is realized as follows.

Before the start of the process of conversion, the control module CM causes the switching off the reference current source $I_R$ by the use of the signal from the reference output $P_R$, and also the switching off the signal current source $I_S$ by the use of the signal from the signal output $P_S$. Additionally, by the use of signals from the control outputs $P_{n-1}$, $P_{n-2}$, ..., $P_1$, $P_0$, the control module CM causes the switching of change-over switches $S_{n-1}$, $S_{n-2}$, ..., $S_1$, $S_0$ and the connection of the top plates of the capacitors $C_{n-1}$, $C_{n-2}$, ..., $C_1$, $C_0$ in the set of capacitors CS to the ground of the circuit enforcing a complete discharge of all the capacitors $C_{n-1}$, $C_{n-2}$, ..., $C_1$, $C_0$ in the set of capacitors CS. At the instant $t_1$, when the control module CM detects the beginning of the time interval T on the input time interval In, the control module CM introduces the complete conversion output RDY to an inactive state. Next, the control module CM starts generation of the reference time RT (FIG. 2). Then, by the use of the signal from the control output $P_{n-1}$, the control module CM causes the switching of the change-over switch $S_{n-1}$ and the connection of an output of the reference current source $I_R$ to the top plate of the capacitor $C_{n-1}$ having the highest capacitance in the set of capacitors CS. At the same time, by the use of the signal from the reference output $P_R$, the control module CM causes the switching on the reference current source $I_R$. Next, the control module assigns a value one to a bit $b_{n-1}$ of the first n-bit digital word, and a value zero to a bit $b_{n-1}$ of the second n-bit digital word. The reference voltage $U_R$ increasing on a capacitor $C_x$ charged by the use of the reference current source $I_R$ is compared to the threshold voltage $U_{TH}$ by the use of the reference comparator $K_R$. When the reference voltage $U_R$ on the capacitor $C_x$ reaches the threshold voltage $U_{TH}$, then, on the basis of the output signal of the reference comparator $K_R$, the control module CM by the use of the signal from the control output $P_x$ causes the switching of the change-over switch $S_x$ and the connection of the top plate of the capacitor $C_x$ to the ground of the circuit enforcing a complete discharge of this capacitor. At the same time, the control module CM by the use of the signal from the control output $P_z$ causes the switching of the change-over switch $S_Z$ and the connection of the output of the reference current source $I_R$ to the top plate of the capacitor $C_Z$ such that it has the highest capacitance among the capacitors CS in the set of capacitors that have not been charged yet.

Next, the control module assigns a value one to a bit $b_Z$ of the first n-bit digital word, and a value zero to a bit $b_Z$ of the second n-bit digital word. The reference voltage $U_R$ increasing on a capacitor $C_x$ charged by the use of the reference current source $I_R$ is compared to the threshold voltage $U_{TH}$ by the use of the reference comparator $K_R$. The cycle is repeated until the generation of the reference time RT is terminated at the same instant $t_3$. At the instant $t_2$, when the control module CM detects the end of the time interval T on the input time interval In, the control module CM starts to generate the signal time ST (FIG. 2). Then, by the use of the signal from the control output $P_z$, the control module CM causes the switching of the change-over switch $S_Z$ and the connection of an output of the signal current source $I_S$ to the top plate of the capacitor $C_Z$ such that it has the highest capacitance among the capacitors CS in the set of capacitors that have not been charged yet. At the same time, by the use of the signal from the signal output $P_S$, the control module CM causes the switching on the signal current source $I_S$. Next, the control module assigns a value zero to a bit $b_{n-1}$ of the first n-bit digital word, and a value one to a bit $b_{n-1}$ of the second n-bit digital word. The signal voltage $U_S$ increasing on a capacitor $C_y$ charged by the use of the signal current source $I_S$ is compared to the threshold voltage $U_{TH}$ by the use of the signal comparator $K_S$. When the signal voltage $U_S$ equals the threshold voltage $U_{TH}$, then, on the basis of the output signal of the reference signal $K_S$, the control module CM by the use of the signal from the control output $P_y$ causes the switching of the change-over switch $S_y$ and the connection of the top plate of the capacitor $C_y$ to the ground of the circuit enforcing a complete discharge of this capacitor. At the same time, the control module CM by the use of the signal from the control output $P_z$ causes the switching of the change-over switch $S_Z$ and the connection of the output of the signal current source $I_S$ to the top plate of the capacitor $C_z$ such that it has the highest capacitance among the capacitors CS in the set of capacitors that have not been charged yet. The cycle is repeated until generation of the signal time ST is terminated at the same instant $t_3$.

The generation of the reference time RT and the generation of the signal time ST are terminated by the control module CM at the instant $t_3$ (FIG. 2) when the capacitor $C_0$ of the lowest capacitance in the set of capacitors CS is charged, and when the control module CM on the basis of the output signal of the reference comparator $K_R$ detects that the reference voltage $U_R$ increasing on a capacitor $C_x$ charged by the use of the reference current source $I_R$ equals the threshold voltage $U_{TH}$, or when the control module CM on the basis of the output signal of the source comparator $K_S$ detects that the signal voltage $U_S$ increasing on a capacitor $C_y$ charged by the use of the signal current source $I_S$ equals the threshold voltage $U_{TH}$. In the latter case, the value of the first n-bit digital word is decreases by one by use of the control module CM.

Next, in both cases, the control module CM by the use of the signal from the reference output $P_S$ causes the switching off the reference current source $I_R$ and by the use of the signal from the signal output $P_S$ causes the switching off the signal current source $I_S$. Additionally, by the use of the signal from the control outputs $P_{n-1}, P_{n-2}, \ldots, P_1, P_0$, the control module CM causes the switching of the change-over switches $S_{n-1}, S_{n-2}, \ldots, S_1, S_0$ and the connection of the top plates of all the capacitors $C_{n-1}, C_{n-2}, \ldots, C_1, C_0$ to the ground of the circuit enforcing a complete discharge of all the capacitors $C_{n-1}, C_{n-2}, \ldots, C_1, C_0$ in the set of capacitors CS. The control module CM evaluates values of bits $b_{n-1}, b_{n-2}, \ldots, b_1, b_0$ in the n-bit output digital word B subtracting a value of the second n-bit digital word from a value of the first n-bit digital word. Next, the control module CM introduces the complete conversion output RDY to an active state.

In the second embodiment, the apparatus for conversion of a time interval to a digital word using a successive approximation scheme differs from the version presented in aforementioned example in that the control module CM by the use of the control signal from the reference output $P_R$ causes a decrease of intensity of the reference current source $I_R$ below intensity of the signal current source $I_S$ at the instant $t_1$, when the control module CM detects the beginning of the time interval T on the input time interval In. At the instant $t_2$, when the control module CM detects the end of the time interval T on the input time interval In, the control module CM by the use of the control signal from the reference output $P_R$ causes an increase of intensity of the reference current source $I_R$ to intensity of the signal current source $I_S$.

In another embodiment, the control module CM evaluates values of bits $b_{n-1}, b_{n-2}, \ldots, b_1, b_0$ in the n-bit output digital word B as a conversion result by assigning a value one to a bit $b_x$ in this digital word B if, a next capacitor $C_{x-1}$ is not started to be charged by the use of the signal current source $I_S$ during a time when a capacitor $C_x$ corresponding to the bit $b_x$ in the set of capacitors CS is charged by the use of the reference current source $I_R$, or, a next capacitor $C_{y-1}$ is started to be charged by the use of the reference current source $I_R$ during a time when a capacitor $C_y$ corresponding to the bit $b_y$ in the set of capacitors CS is charged by the use of the signal current source $I_S$. Otherwise, the control module CM assigns a value zero to the bits in this digital word B.

ACRONYMS

In time input
$In_S$ signal input
$In_R$ reference input
$P_S$ signal output
$P_R$ reference output
B digital output
$b_{n-1}, b_{n-2}, \ldots, b_1, b_0$ bits of digital output
RDY complete conversion output
$I_S$ signal current source
$I_R$ reference current source
S signal rail
R reference rail
$K_S$ signal comparator
$K_R$ reference comparator
CS set of capacitors
$C_{n-1}, C_{n-2}, \ldots, C_1, C_0$ capacitors
$C_{n-1}$ capacitor having the highest capacitance in the set of capacitors
$C_0$ capacitor having the lowest capacitance in the set of capacitors
$S_{n-1}, S_{n-2}, \ldots, S_1, S_0$ change-over switches
$P_{n-1}, P_{n-2}, \ldots, P_1, P_0$ control outputs
CM control module
$U_S$ signal voltage
$U_R$ reference voltage
$U_{TH}$ threshold voltage
$U_{DD}$ supply voltage
T time interval
$t_1$ instant when the beginning of the time interval T is detected
$t_2$ instant when the end of the time interval T is detected
$t_3$ instant when generation of the reference time RT and the signal time ST is terminated
ST signal time
RT reference time

What is claimed is:

1. A method for conversion of a time interval to a digital word using a successive approximation scheme, in an apparatus having a control module, consisting of a detection of a beginning and of an end of the time interval by the use of the control module, and in assignment of a corresponding binary value represented by n-bit output digital word to the time interval by the use of the control module, said method comprising:

mapping the time interval (T) to a difference of a length of a reference time (RT) and a length of a signal time (ST), while the reference time (RT) is generated from an instant ($t_1$) when the beginning of the time interval (T) is detected by the use the control module (CM), and the signal time (ST) is generated from an instant ($t_2$) when the end of the time interval (T) is detected by the use of the control module (CM), and terminating a generation of the reference time (RT) and the signal time (ST) at the same instant ($t_3$).

2. The method according to claim 1, wherein a generation of the reference time (RT) is realized by charging a capacitor using a reference current source ($I_R$), while this capacitor is selected by the use of the control module (CM) from a set of capacitors (CS) comprising capacitors ($C_{n-1}, C_{n-2}, \ldots, C_1, C_0$), such that a capacitance of a capacitor of a given index is twice as high as a capacitance of a capacitor of the previous index, and a capacitor ($C_{n-1}$) of the highest capacitance in the set of capacitors (CS) is selected first, while a selected capacitor is charged as long as the reference voltage ($U_R$) increasing on the selected capacitor and compared to the threshold voltage ($U_{TH}$) by the use of the reference comparator ($K_R$) reaches the threshold voltage ($U_{TH}$), and then, a next capacitor in the set of capacitors (CS) is started to be charged while this capacitor has the highest capacitance among the capacitors that have not been charged yet, and the reference voltage ($U_R$) increasing on this capacitor being charged is compared to the threshold voltage ($U_{TH}$) by the use of the reference comparator ($K_R$), and the cycle is repeated to the end of generation of both time intervals, while generation of the signal time (ST) is realized by charging a capacitor by the use of the signal current source ($I_S$), while this capacitor is selected by the use of the control module (CM) from the set of capacitors (CS) has the highest capacitance among the capacitors that have not been charged yet, and the selected capacitor is charged as long as the signal voltage ($U_S$) increasing on this capacitor and compared to the threshold voltage ($U_{TH}$) by the use of the signal comparator ($K_S$) reaches the threshold voltage ($U_{TH}$), and then, a next capacitor in the set of capacitors (CS) is started to be charged by the use of the signal current source ($I_S$) while this capacitor is selected in the same way and the cycle is repeated, and the generation of the reference time (RT) and the generation of the signal time (ST) are terminated during the time when the capacitor ($C_0$) of the lowest capacitance in the set of capacitors (CS) is charged, and when the reference voltage ($U_R$) increasing on a capacitor charged by the use of the reference current source ($I_R$), or when the signal voltage ($U_S$) increasing on a capacitor charged by the use of the signal current source ($I_S$) reaches the threshold voltage ($U_{TH}$).

3. The method according to claim 2, wherein intensity of the reference current source ($I_R$) is lower than intensity of the signal current source ($I_S$) during the time interval (T), and intensity of the reference current source ($I_R$) is increased by the use of the control module (CM) to intensity of the signal current source ($I_S$) at the instant ($t_2$) when generation of the time interval (T) is terminated by the use of the control module (CM).

4. The method according to claim 2, wherein the binary value represented by n-bit output digital word (B) is evaluated by the use of the control module (CM) by subtracting a value of a second n-bit digital word from a value of a first n-bit digital word, while a value one is assigned to bits of the first digital word if capacitors in the set of capacitors (CS) corresponding to these bits have been charged by the reference current source ($I_R$), and a value zero is assigned to other bits of the first digital word, whereas the inverted values of the first digital word are assigned to corresponding bits of the second digital word by the use of the control module (CM), and finally the value of n-bit output digital word (B) is decreased by one if a voltage on the last capacitor charged by the reference current source ($I_R$) has not reached the threshold voltage ($U_{TH}$).

5. The method according to claim 2, wherein a binary value of n-bit output digital word (B) is evaluated by the use of the control module (CM) such that the control module (CM) assigns a value one to a bit ($b_j$) in this digital word if, a next capacitor ($C_{j-1}$) is not started to be charged by the use of the signal current source ($I_S$) during a time when a capacitor ($C_j$) corresponding to the bit ($b_j$) in the set of capacitors (CS) is charged by the use of the reference current source ($I_R$), or, a next capacitor ($C_{j-1}$) is started to be charged by the use of the reference current source ($I_R$) during a time when a capacitor ($C_j$) corresponding to the bit ($b_j$) in the set of capacitors (CS) is charged by the use of the signal current source ($I_S$), while the control module (CM) assigns a value zero to the bit ($b_j$) otherwise.

6. An apparatus for conversion of a time interval to a digital word using a successive approximation scheme comprising a control module having a time input, a digital output, a complete conversion output, a reference input connected to a reference comparator output, a signal input connected to a signal comparator output, a reference output connected to a control input of a reference current source, a signal output connected to a control input of a signal current source, and outputs that control change-over switches of a set of capacitors, while a capacitance value of a capacitor of a given index is twice as high as a capacitance value of the capacitor of the previous index, and a non-inverting input of the reference comparator is connected to a reference rail and to an output of the reference current source, whose input is connected to a source of a voltage supply, and an inverting input of the reference comparator is connected to a source of a threshold voltage, the apparatus comprising:

a non-inverting input of the signal comparator ($K_S$) configured for connection to the signal rail (S) and to the output of the signal current source ($I_S$) whose input is connected to the source of the voltage supply ($U_{DD}$), the inverting input of the signal comparator ($K_S$) configured for connection to the source of the threshold voltage ($U_{TH}$) and to the inverting input of the reference comparator ($K_R$), and bottom plates of capacitors ($C_{n-1}$, $C_{n-2}$, ..., $C_1$, $C_0$) of the set of capacitors (CS) configured for connection to a ground of the circuit, and top plates of capacitors ($C_{n-1}$, $C_{n-2}$, ..., $C_1$, $C_0$) are connected, respectively, to moving contacts of change-over switches ($S_{n-1}$, $S_{n-2}$, ..., $S_1$, $S_0$) whose first stationary contacts are connected to the signal rail (S), second stationary contacts are connected to the ground of the circuit, and third stationary contacts are connected to the reference rail (R).

7. The apparatus according to claim 6, wherein the signal current source ($I_S$) and the reference current source ($I_R$) have the same intensity.

8. The apparatus according to claim 6, wherein the intensity of the reference current source ($I_R$) is controllable.

* * * * *